(12) United States Patent
Kim

(10) Patent No.: US 7,577,051 B1
(45) Date of Patent: Aug. 18, 2009

(54) SRAM INCLUDING REDUCED SWING AMPLIFIERS

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 12/415,272

(22) Filed: Mar. 31, 2009

Related U.S. Application Data

(63) Continuation of application No. 11/872,715, filed on Oct. 16, 2007, now Pat. No. 7,542,331, and a continuation-in-part of application No. 11/876,117, filed on Oct. 22, 2007, now Pat. No. 7,388,774, and a continuation-in-part of application No. 12/202,263, filed on Aug. 30, 2008.

(51) Int. Cl.
*G11C 7/00* (2006.01)
(52) U.S. Cl. .................... 365/205; 365/154; 365/194
(58) Field of Classification Search .............. 365/154, 365/194, 205
See application file for complete search history.

(56) References Cited

U.S. PATENT DOCUMENTS

| 5,179,033 | A | 1/1993 | Adan |
| 5,780,910 | A | 7/1998 | Hashimoto et al. |
| 6,205,049 | B1 | 3/2001 | Lien et al. |
| 6,442,089 | B1 | 8/2002 | Fletcher et al. |
| 6,972,450 | B2 | 12/2005 | Liaw |
| 7,158,428 | B2 | 1/2007 | Fujimoto |
| 2004/0130926 | A1* | 7/2004 | Nakase ................ 365/145 |
| 2004/0164767 | A1* | 8/2004 | Afghahi et al. ............ 326/86 |

OTHER PUBLICATIONS

A Low Power Embedded SRAM for Wireless Applications, IEEE Solid-States Circuits, vol. 42, No. 7, Jul. 2007.
A low power SRAM Using Hierarchical Bit Line and Local read amplifiers, Yang et al, IEEE Journal of Solis-State Circuits, vol. 40, No. 6, Jun. 2005.

* cited by examiner

*Primary Examiner*—Hoai V Ho

(57) ABSTRACT

SRAM includes reduced swing amplifiers, such that a first reduced swing amplifier serves as a local sense amp for reading a memory cell through a short local bit line, a second reduced swing amplifier serves as a segment sense amp for reading the local sense amp, and a third reduced swing amplifier serves as a global sense amp for reading the segment sense amp through a global bit line. When reading data, a voltage difference in the local bit line is converted to a time difference by the sense amps for differentiating low data and high data, which realizes low power consumption with the reduced swing amplifiers. And, lightly local bit line is quickly discharged when reading, which realizes fast operation. Furthermore, the local bit line is discharged by the reduced memory cell, which reduces area. Additionally, alternative circuits and memory cell structures for implementing the SRAM are described.

8 Claims, 7 Drawing Sheets

Truth table

| nsdata | sdata | cdata | ncdata | Match line | Result |
|---|---|---|---|---|---|
| 0 | 0 | x | x | High | Match |
| 1 | 0 | 1 | 0 | Low | Mis-match |
| 1 | 0 | 0 | 1 | High | Match |
| 0 | 1 | 1 | 0 | High | Match |
| 0 | 1 | 0 | 1 | Low | Mis-match |

T21  T22  T23  T24  T25  T26

T31, T32, T33, T34, T35

Metal-1  FIG. 8D

Metal-4  FIG. 8G

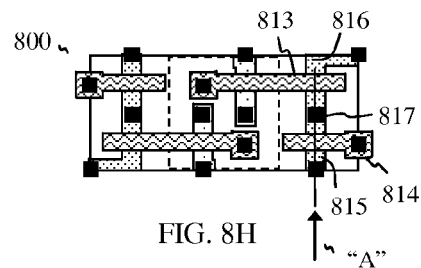
FIG. 8H
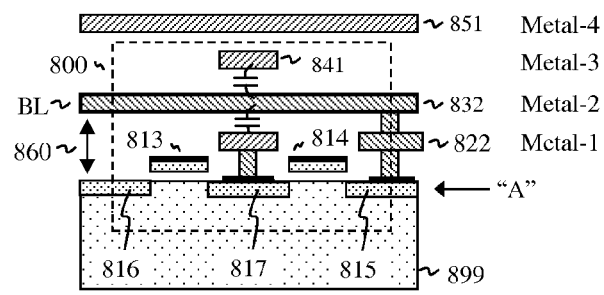
FIG. 8I
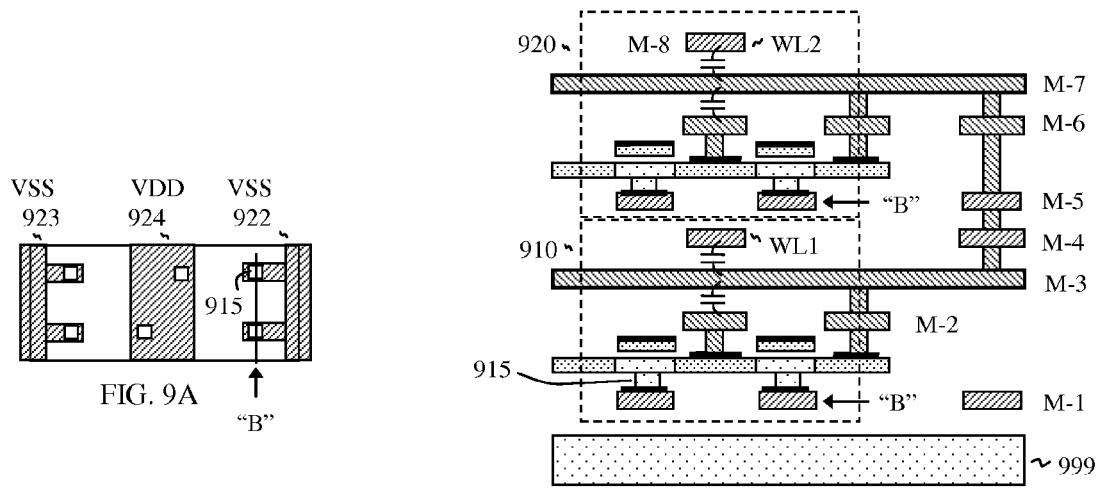
FIG. 9A
FIG. 9B

SRAM INCLUDING REDUCED SWING AMPLIFIERS

CROSS REFERENCE TO RELATED APPLICATION

The present invention is a continuation of application Ser. No. 11/872,715, filed on Oct. 16, 2007, now issued as U.S. Pat. No. 7,542,331, application Ser. No. 11/876,117, filed on Oct. 22, 2007, now U.S. Pat. No. 7,388,774, and application Ser. No. 12/202,263, filed on Aug. 30, 2008, which are herein incorporated by reference.

FIELD OF THE INVENTION

The present invention relates generally to integrated circuits, in particular to SRAM (Static Random Access Memory).

BACKGROUND OF THE INVENTION

For its high-speed and short cycle time, the SRAM (Static Random Access Memory) is utilized extensively as a cache memory in computer systems and network systems. Furthermore, the SRAM is simple to use with no refresh operation. As such, the SRAM constitutes a key component that holds sway on the speed and performance of the computer systems and other systems. Efforts of research and development have been under way primarily to boost the operating speed of the memory.

FIG. 1 illustrates a circuit diagram of a conventional SRAM including memory segment, a write circuit and a sense amplifier, as published, U.S. Pat. No. 4,712,194 and No. 6,075,729. The memory block 100 includes memory cells 110, 111, 112 and 113 having six transistors. The memory cells are connected to bit lines 121, 122, 123 and 124, which bit lines are pre-charged by pre-charge circuits 125 and 126, respectively. During standby, the pre-charge circuits 125, 126 and 127 preset the bit lines to high. After then, the bit lines are released from the pre-charge state when read and write. Thus the stored voltage of the memory is transferred to the sense amp 160 through transfer gates. When the memory cell 110 is selected, the transfer gates 141 and 142 are turned on, while the other transfer gates 143 and 144 keep turn-off state. In doing so, the memory cell data is read by the sense amp 160 through the common bit lines 151 and 152. The read output of the sense amp 160 is transferred to output node 190 through a transfer gate 161, while unselected memory block 170 and unselected sense amp 180 are in pre-charge state and transfer gate 181 keeps turn-off state. When write, write buffers 131 and 132 transfer input data to write circuit 133, so that the input data is transferred to the memory cell through bit lines when word lines of the memory cell are asserted to high.

In the conventional SRAM, six-transistor memory cell 110 is used to store data, such that a latch including two cross coupled inverters stores voltage data. In order to achieve fast access, the latch of the memory cell should be strong enough to drive heavily loaded bit line, but the latch should be weak enough to be flipped by the write circuit 133 through the transfer gates 141 and 142. Furthermore, heavily loaded bit lines may flip unselected memory cells during read and write operation. For example, the unselected memory cell 112 receives same word line voltage as that of the selected memory cell 110, so that the memory cell 112 will lose its data when the latch is too weak and the bit line loading is too heavy because both bit lines 123 and 124 are floating from pre-charged high voltage, while the selected bit line 121 and 122 receive input data from write circuit 133. And the pass (transfer) transistor of the memory cell should be strong enough to transfer charges for reading and writing. As a result, the transistors in the memory cell are bigger than minimum feature size within the fabrication process limit typically, which increases the chip area.

For writing data, a write data line pair 134 and 135 is connected to the write circuit 133 and another memory block 170. Conventionally, the write data line pair is heavily loaded with no buffers, so that the write data lines always drive full length of the memory block, which increases driving current and RC delay time. For reading data, a read data line 190 is connected to sense amps 160 and 180. Alternatively, a pair of read data lines can be used typically for amplifying a voltage difference. Thus, access time is different from location of the selected sense amp. For example, access time from the sense amp 160 is faster than that of the sense amp 180, so that it is difficult to latch sense amp output at high speed because a latching clock is fixed (not shown). Furthermore, the read data line is also heavily loaded for connecting to multiple memory blocks with no buffers, which increases driving current and RC delay time as well.

There are many efforts to improve the conventional SRAM with new circuit concepts, such that memory array is multi-divided in order to reduce parasitic loading of bit line by introducing hierarchical bit line architecture and multi-stage sense amp, as published U.S. Pat. No. 7,158,428 and U.S. Pat. No. 6,442,089. However, each memory segment including the bit line comprises more circuits such as a cross-coupled keeper transistor circuit, a local read amplifier circuit, pre-charge transistors, and transfer transistors, which increases chip area. And another prior art is shown, "A Low Power Embedded SRAM for Wireless Applications", IEEE Solid-States Circuits, Vol. 42, No. 7, July 2007. In this prior art, bit lines are multi-divided but sense amps include more transistors, so that the area may be increased, and write circuit is increased as well. And one more prior art is shown, "A low power SRAM Using Hierarchical Bit Line and Local read amplifiers", Yang et al, IEEE Journal of Solis-State Circuits, Vol. 40, No. 6, June 2005, such that the local read amplifier improves write operation, but it does not improve read operation because the local read amplifier is not activated during read cycle. As a result, the access time is still slow and area may be increased more.

Furthermore, in the bulk CMOS SRAM, the current driving ability of the load MOS transistors drops if the miniaturization of the memory cell size further advances. If the operation voltage further drops, the amount of charge stored in the storage node drops, so that the potential fluctuation of the storage node due to alpha rays cannot be suppressed, deteriorating the soft error resistance. There are some improvements with capacitor in the memory cell, as published in U.S. Pat. No. 6,972,450, No. 5,780,910 and No. 5,179,033. However, these approaches solve only memory cell portion, but they don't suggest any new improvements with peripheral circuits such as sense amps, in order to miniaturize the memory cell.

In this respect, there is still a need for improving the static random access memory. In the present invention, SRAM including reduced swing amplifiers is realized for reducing power consumption. And bit lines are multi-divided for reducing the parasitic capacitance of the bit line, which realizes high speed operation. For reading the divided bit line more effectively, multi-stage sense amps are used. And with the multi-stage sense amps, a time-domain sensing scheme is realized in order to differentiate low voltage data and high voltage data in the time-domain, which does not require the conventional sense amp, because the multi-stage sense amps convert a voltage difference of the bit line to a current difference, and then the current difference is converted to a time difference. Furthermore, a buffered data path is used for realizing fast write and read operation. Furthermore, the lightly loaded bit line does not disturb the unselected cells when writing and reading. Additionally the SRAM cell includes a stacked capacitor for preserving charges, which increases alpha ray immunity.

The memory cell can be formed on the surface of the wafer. And the steps in the process flow should be compatible within the current CMOS manufacturing environment. Alternatively, the memory cell can be formed from thin film polysilicon layer, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In particular, a body-tied TFT (Thin Film Transistor) transistor can be alternatively used as the thin film transistor for alleviating self heating problem of short channel TFT. In doing so, multi-stacked SRAM is realized with short channel TFT transistor.

SUMMARY OF THE INVENTION

In order to read a memory cell in the SRAM, reduced swing amplifiers are used such that a first reduced swing amplifier serves as a local sense amp for reading the memory cell through a local bit line, a second reduced swing amplifier serves as a segment sense amp for reading the local sense amp through a segment bit line, and a third reduced swing amplifier serves as a global sense amp for reading the segment sense amp through a global bit line. The reduced swing amplifiers are supplied by an array voltage which is lower than that of other circuits, such as, data transfer circuit and decoder in peripheral circuits. Hence, operation power is significantly reduced with the reduced swing amplifiers. Furthermore, the array voltage of the amplifiers can be variable with a variable voltage regulator and a power control circuit for minimizing the operation power, such that the array voltage is reduced to 0.5V during standby, for instance, while the array voltage is raised to 0.8V when activated.

And SBL (short bit line) or LBL (light bit line) architecture is applied for reducing parasitic capacitance of a local bit line, so that the local bit line is lightly loaded. In doing so, the light bit line is quickly charged or discharged when reading and writing, which realizes fast operation. When reading, a stored data in a memory cell is transferred to a latch circuit through multi-stage sense amps such that low data is transferred to the latch circuit with high gain, but high data is not transferred with low gain. By the sense amps, a voltage difference in the bit line is converted to a time difference as an output of the global sense amp with gain. In this manner, a time-domain sensing scheme is realized to differentiate low data and high data stored in the memory cell. For instance, low data is quickly transferred to the latch circuit through the sense amps with high gain, but high data is rejected by a locking signal based on low data as a reference signal.

More specifically, a reference signal is generated by one of fast changing data with high gain from reference cells, which signal serves as a reference signal to generate the locking signal for the latch circuit in order to reject latching another data which is slowly changed with low gain, such that low voltage data is arrived first while high voltage data is arrived later, or high voltage data is arrived first while low voltage data is arrived later depending on configuration. The time-domain sensing scheme effectively differentiates low voltage data and high voltage data with time delay control, while the conventional sensing scheme is current-domain or voltage-domain sensing scheme. In the convention memory, the selected memory cell discharges the bit line, and the discharged voltage of the bit line is compared by a comparator which determines an output at a time. In the present invention, there are many advantages to realize the time-domain sensing scheme, so that the sensing time is easily controlled by a tunable delay circuit, which compensates cell-to-cell variation and wafer-to-wafer variation, such that there is a need for adding a delay time before locking the latch circuit with a statistical data for all the memory cells, such as mean time between fast data and slow data. Thereby the tunable delay circuit generates a delay for optimum range of locking time. And the read output from the memory cell is transferred to the latch circuit through a returning read path, thus the access time is equal regardless of the location of the selected memory cell, which is advantageous to transfer the read output to the external pad at a time.

Furthermore, configuring memory is more flexible, such that multiple memory macros can be easily configured with small segmented memory array and multi-stage sense amps, instead of big macro with the conventional sense amps. And number of sense amps can be determined by the target speed. For example, high speed application needs more segmented array with more sense amps, while high density application needs more memory cells with reduced number of sense amps, thus cell efficiency is increased.

In order to match the width of the local sense amp with the memory cell, a left local sense amp is placed on the left side and a right local sense amp is placed on the right side. And the segment sense amps are also fit with the local sense amp. One of prime advantages is that the local sense amp occupies small area with six to eight transistors, and the segment sense amp is even smaller than the local sense amp with three transistors only. And write circuits are included in the local sense amp. And the global sense amp is shared by eight columns, and also data transfer circuit is included in the global sense amp. As a result, the chip area is reduced by replacing the conventional sense amp with multi-stage sense amps. In contrast, conventional architecture needs more area for adding differential amplifier. And the differential amplifier occupies more space for connecting common nodes of cross coupled transistor pairs which require a balance for matching threshold voltage with non-minimum transistors. Furthermore, the local sense amp has high gain with wider width channel MOS transistor than that of the memory cell, and the segment sense amp has higher gain than that of the local sense amp, which realizes fast read operation.

And a buffered data path is connected to the global sense amp for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

When writing, the latch of the memory cell should be weak enough to be flipped by the write circuit through the write transfer gate, and the latch of the memory cell should be strong enough to drive the bit line when reading. For example, when a word line is asserted to high, a selected memory cell may lose its data when the memory cell is too weak and the bit line loading is too heavy because the charges from the bit line is injected to the storage node of the memory cell. However, in the present invention, the activated memory cell is not disturbed or less disturbed by the bit line because loading of the bit line is very light.

Furthermore, the current flow of the transistors in the memory cell can be reduced because the transistors only drive a lightly loaded bit line, which means that the transistors can be miniaturized further. Moreover, the present invention realizes multi-stacked memory cell structure including thin film transistor, because the memory cell only drives lightly loaded bit line even though thin film polysilicon transistor can flow lower current, around 10-20 times lower, for example. In particular, body-tied TFT is used to form a memory cell, for alleviating self heating problem in short channel thin film transistor, which realizes to miniaturize the memory cell, more effectively. The TFT transistor can be used as pull-up transistor in the memory cell. Alternatively, the TFT transistors are used as transistors in a whole memory cell including pass transistor and cross coupled inverter latch. And the memory cell can be formed from various semiconductor materials, such as single crystalline silicon, polycrystalline silicon, silicon-germanium and germanium.

Still furthermore, various alternative configurations are described for implementing the multi-stage sense amps, and an example application for content addressable memory is described as well. And, an example memory cell layout and cross sectional views are illustrated to minimize cell area.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIGS. 8A, 8B, 8C, 8D, 8E, 8F, and 8G illustrate an example of memory cell layout, FIG. 8H illustrates base layers for explaining a cross sectional view of the related memory cell, and FIG. 8I illustrates a cross sectional view of the related memory cell, according to the teachings of the present invention.

FIG. 9A illustrates metal layer for explaining a cross sectional view of the related memory cell, FIG. 9B illustrates a cross sectional view of the related memory cell with body-tied TFT, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
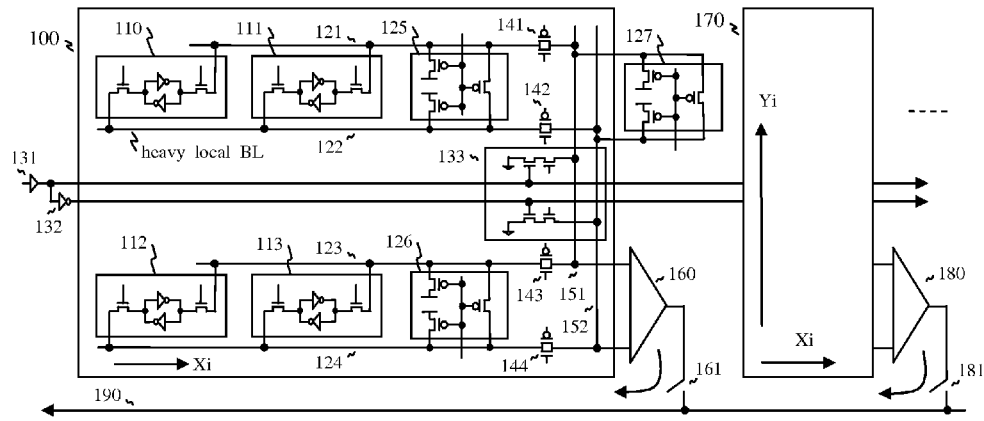
FIG. 1 illustrates the static random access memory, as a prior art.
Figure 2A:
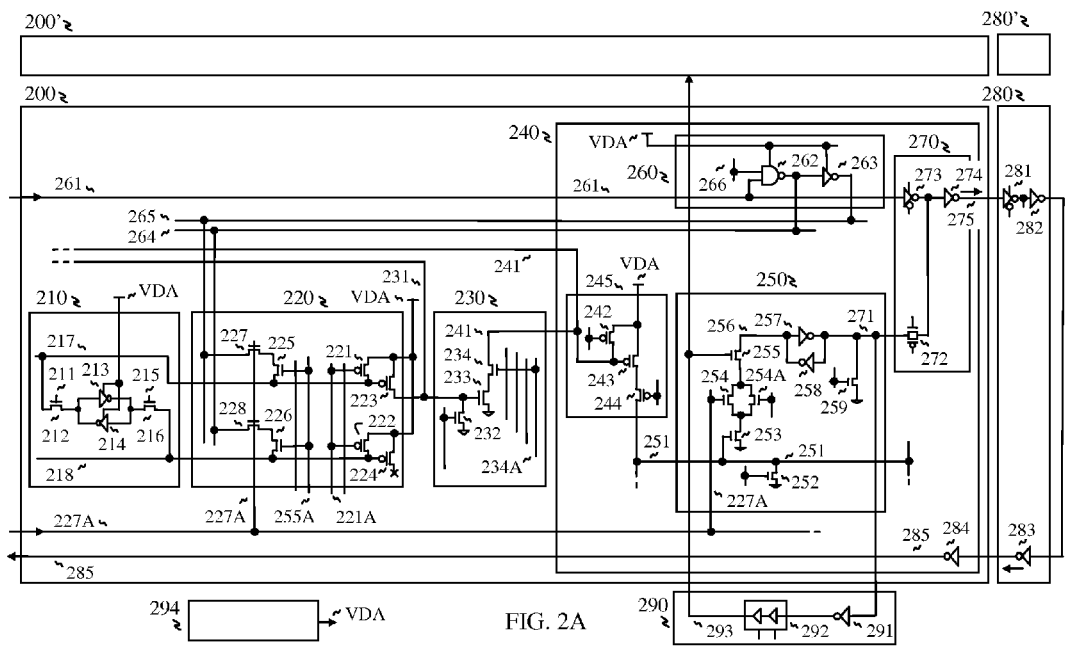
FIG. 2A illustrates SRAM including reduced swing amplifiers.

The present invention is directed to SRAM including reduced swing amplifiers as shown in FIG. 2A, wherein a memory block 200 comprises a memory cell 210, a local sense amp 220, a segment sense amp 230, and a global sense amp 240. The memory cell 210 is composed of two pass transistors and a cross coupled inverter latch, the pass transistors 212 and 216 are controlled by word line 211 and 215, and the cross coupled inverter latch including two inverters 213 and 214 are connected to the pass transistors.

In particular, the reduced swing amplifiers are used for reading the memory cell, such that a first reduced swing amplifier serves as the local sense amp 220 for reading the memory cell through a local bit line pair 217 and 218, a second reduced swing amplifier serves as the segment sense amp 230 for reading the local sense amp through a segment bit line 231, and a third reduced swing amplifier serves as the global sense amp 240 for reading the segment sense amp through a global bit line 241. And the reduced swing amplifiers are supplied by an array voltage VDA as an amplifier supply voltage which is variable for adjusting voltage swing. For example, the array voltage is lowered to 0.5V during standby, and then the array voltage is raised to 0.8V for operation, where a settling time is required for the operation. In this manner, power consumption is significantly reduced with the variable array voltage. The array voltage VDA is internally generated by the variable voltage regulator 294. Detailed voltage regulator circuit will be shown in FIG. 6D. With the reduced swing amplifiers, low power operation is realized because charging and discharging current are reduced. And for reducing parasitic capacitance, the bit lines are multi-divided such that length of the bit line is shorter than that of conventional circuit. For instance, bit line loading is one-fourth, one-eighth or one-sixteenth, compared with the conventional memory.

The first reduced swing amplifier (as the local sense amp) 220 is composed of a local pre-charge transistor 221 for pre-charging a (non-inverting) local bit line 217 and another local pre-charge transistor 222 for pre-charging an inverting local bit line 218, a write transistor series 225 and 227 and another write transistor series 226 and 228 for writing data through a write bit line pair 264 and 265, and a local amplify transistor 223 for reading the local bit line 217 while another amplify transistor 224 is used only for compensating gate capacitor to the inverting local bit line 218, which matches bit line loading with the local bit line 217, where drain of the transistor 224 is floating.

The second reduced swing amplifier (as the segment sense amp) 230 is composed of a segment reset transistor 232 for resetting the segment bit line 231, a segment amplify transistor 233 for reading the segment bit line 231, and a segment enable transistor 234 for enabling the segment amplify transistor 233.

The global sense amp 240 is composed of four circuits including the third reduced swing amplifier 245 (as a read circuit) for reading the segment sense amp 230, a write circuit 260 for writing a write data, a latch circuit 250 for storing a read output and a data transfer circuit 270 for selecting the read output or a data from previous memory block. More specifically, the write circuit 260 is composed of a receiving gate 262 and an inverting gate 263, such that the receiving gate 262 is connected to forwarding write line 261 serving as forwarding write path, and the inverting gate 263 receives an output from the receiving gate for driving a write bit line pair 264 and 265. For writing, the local bit line pair is driven by the receiving gate and the inverting gate through the write bit line pair 264 and 265. And the third reduced swing amplifier 245 is composed of a global pre-set transistor 242 for pre-setting the global bit line 241 to the array voltage VDA (as the amplifier supply voltage), a global amplify transistor 243 for reading the global bit line 241, and a global amp enable transistor 244 for enabling the global amplify transistor 243.

And the latch circuit 250 is composed of a cross coupled inverter latch which includes inverters 257 and 258. The latch circuit is connected to a left latch node 256 and a right latch node 271. The left latch node 256 is connected to a pull-down path including a locking transistor 255, two column select transistors 254 and 254A, and a latch flip transistor 253 for receiving output of the read circuit 245 through a global amp node 251, where the global amp node 251 is reset by a global node reset transistor 252. And the right latch node 271 is connected to a latch reset transistor 259 for resetting the right latch node 271. In the latch circuit, the pull-down path serves as a level shifter for transferring a read data to the latch circuit when reading data "0", but the pull-down path is in off-state when reading data "1".

And the data transfer circuit 270 is composed of a read switch having a transmission gate 272, a write switch having a bypass tri-state inverter 273 for bypassing a data from a previous memory block, and a read inverter 274 which receives an output from the read switch 272 or the write switch 274. And the read inverter 274 is connected to a forwarding read line 275. And the bypass tri-state inverter 273 receives the write data connecting to the forwarding write line 261 for bypassing when the memory block 200 is not selected. When reading, the bypass tri-state inverter 273 is disabled for the selected memory block 200, while unselected tri-state inverter 281 in unselected memory block 280 is turned on to bypass an output from the previous block 200 but unselected read switch (not shown) is turned off. And the forwarding read line 275 is connected to a returning read path including multiple inverting buffers, 281 and 282, and returning buffer 283 and 284, wherein the returning buffer 284 is connected to the returning read line 285 as an output node.

By disabling the bypass tri-state inverter 273 in the selected memory block 200, data path is divided into the forwarding write path and the returning read path, which realizes to reduce RC time constant and driving current, because data line is divided into short line while unselected portion of the data line is not discharging when writing. Furthermore, unselected portion of the data line is used as a read data line which is the forwarding read line 275. Thus, the forwarding read line 275 receives the read output from the memory cell through multi-stage sense amps. And the read output is also buffered and connected to the data output node 285 through multiple buffers and the returning read line. With the returning read path, access time is almost same regardless of selected memory cell location, which realizes to latch the read output at a time with enough set-up and hold time even though a latch clock is fixed.

In order to reduce chip area, multiple memory cells are connected to one local sense amp through the local bit line pair, multiple local sense amps are connected to one segment sense amp through the segment bit line, and also multiple segment sense amps are connected to one global sense amp through the global bit line. In this manner, the first reduced swing amplifier serves as the local sense amp 220 which drives the segment bit line 231 as a capacitive load. And the second reduced swing amplifier serves as the segment sense amp 230 which drives the global bit line 241 as a capacitive load. The global sense amp 240 serves as the third reduced swing amplifier. Hence, low power consumption is realized with reduced swing amplifiers which are supplied by the array voltage VDA as an array voltage for the memory blocks, such that the pre-charged voltage VDA of the reduced swing amplifiers is lower than the supply voltage VDD. Furthermore, the array voltage VDA can be variable. For example, the array voltage is lowered to 0.5V during standby, and then the array voltage is raised to 1.0V for operation, where a settling time is required for the operation. In this manner, power consumption is significantly reduced with variable array voltage.

For reading a stored data from the memory cell 210, the local sense amp 220 is released from pre-charge state, such that the local pre-charge transistor 221 is turned off to release the non-inverting local bit line 217, another local pre-charge transistor 222 is also turned off to release the inverting local bit line 218 from pre-charge state, while the write transfer transistors 225 and 226 keep turn-off state even though the column select signal 227A is asserted to high for turning on other write transistors 227 and 228. And when reading, the inverting local bit line 218 is not read. And then, the memory cell 210 is selected by turning on the pass transistors 212 and 216 with the word line 211 and 215, thus the local sense amp 220 reads the memory cell 210. When the stored data is "0", the lightly loaded local bit line (LBL) 217 is quickly discharged to VSS (ground) voltage by the latch including inverters 213 and 214. In other words, a weak and small latch can be used as a storage device for discharging the lightly loaded bit line when reading, which realizes to reduce memory cell area. Detailed memory cell structure will be illustrated as below.

By discharging the local bit line 217, the local amplify transistor 223 pulls up the segment bit line 231. Similarly, by charging the segment bit line 231, a segment amplify transistor 233 in the segment sense amp 230 is turned on while the segment reset transistor 232 is turned off. By turning on the segment amplify transistor 233, the global bit line 241 is discharged to VSS voltage when the segment enable transistor 234 is turned on but the global pre-set transistor 246 is tuned off. When the global bit line 241 is lowered, the global amp node 251 is raised to the VDA voltage, which turns on the first pull-down transistor 256, while the global amp enable transistor 244 is enable but the latch reset transistor 252 is turned off. By turning on the first pull-down transistor 256, the latch node 256 is discharged while the second pull-down transistor 254 is turned on and the locking transistor 255 is also turned on, but the latch reset transistor 259 is turned off. Thus, the other latch node 271 is raised to VDD voltage, where the latch circuit 250 is supplied by VDD voltage. Then, the read inverter 274 receives an output from the other latch node 271 when the read switch 272 is turned on. And, the read output from the read inverter 274 is transferred to the output node 285 through the forwarding read line 275 and inverting buffers 281, 282, 283 and 284, while unselected tri-state inverter 281 in the unselected memory block 280 is turned on, in order to bypass the read output from the selected memory block 200.

In contrast, when the stored data is "1", the local bit line (BL) 217 is not discharged from the pre-charged voltage. Thereby the local amplify transistor 223 is turned off, which does not pull up the segment bit line 231. Thus the segment sense amp keeps turn-off state, and the global sense amp 240 keeps pre-set state. Hence, the read output is not changed, which is read data "1".

In order to reduce turn-off current, the local amplify transistor 223 is composed of longer channel length transistor than that of the segment reset transistor 232 of the segment sense amp, the segment amplify transistor 233 is composed of longer channel length transistor than that of the global pre-set transistor 246 of the global sense amp. Alternatively, the local pre-charge transistors 221 and 222, the segment reset transistor 232 and the global pre-set transistor 246 are composed of low threshold MOS transistor, such that the low threshold transistors keep the pre-charge state strongly with sub-threshold leakage current when reading data "1", because the segment bit line 231 and the global bit line 241 keep pre-charge state while the local amplify transistor 223 is turned off. In addition, the local amplify transistor and the segment amplify transistor are composed of high threshold MOS transistor, for realizing low power operation as another alternative configuration.

When writing, the forwarding write line 261 serves as a write path, such that the (decoded) write circuit including a NAND gate 262 as the receiving gate and the inverting gate 263 is enabled by the write enable signal 266 (high) for receiving a data input from the forwarding write line 261. In doing so, the write bit line pair 264 and 265 is buffered to transfer the write data to the memory cell by the write circuit. During standby, the forwarding write line 261 keeps high, for resetting an input node of the read inverter to VSS voltage while the bypass tri-state inverter 273 is turned on, and all pre-charge signals and select signals are returned to pre-charge state.

Figure 6A:
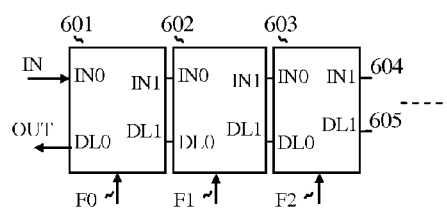
FIG. 6A illustrates a tunable delay circuit.

The local amplify transistor 223 is stronger than the memory cell, and the segment amplify transistor 233 is much stronger than the local amplify transistor 223 with wide channel. Furthermore, the sense amp need not reference bit line because the sense amp does not compare voltage or current with reference bit line, but the sense amp detects whether the local amplify transistor is turned on or not by the selected memory cell through the local bit line. Or the sense amp detects whether the local amplify transistor is strongly or weakly turned on by the selected memory cell. Additionally, the local amplify transistor 223 and the segment amplify transistor 233 can be composed of a low threshold MOS transistor, which achieves fast read operation for high speed applications, even though turn-off current is increased. And the global sense amp 240 transfers the read output through the read path. After then, a locking signal 283 determines the read output whether the transferred data is "0" or "1" with a reference signal which is generated by data "0" because data "0" is reached to the latch circuit early while data "1" is reached later. More specifically, the locking signal 293 is generated by a latch output with a delay circuit 292 which is connected to an inverter 291 connecting to the latch node of a reference column, wherein the reference column 200 stores data "0". Alternatively, the delay circuit is tunable for adjusting the delay time (as shown in FIG. 6A). In this manner, the configuration of the memory block is simpler than the conventional sense amplifier using differential amplifier.

And during write operation, the write transistor series 225 and 227 and another write transistor series 226 and 228 are turned on by write control signals 225A and 227A for over-writing data input to the selected memory cell 210 through the write bit line pair 264 and 265 while the receiving gate 262 is enabled by the write enable signal 266 (high), wherein one of two write control signals 225A can be used for decoding 1 of 4 columns and another signal 227A is used for decoding 1 of 64 columns, as an example. Thus, a data input is transferred to the memory cell through the write bit line pair and the forwarding write line 261. In doing so, the write bit line pair 264 and 265 is buffered and decoded for the selected block 200, which reduces unnecessary charging and discharging current for unselected blocks during write operation. While writing, the lightly loaded bit line does not disturb (or less disturb) the memory cell in the unselected columns. And the segment bit line 231 can be charged when writing data "0" while the segment reset transistor 232 is turned off, but the global bit line does not discharged by turning off the segment enable transistor 234.

Figure 2B:
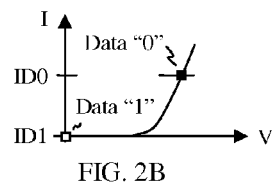
FIG. 2B illustrates I-V curve of the local amplify transistor.

Referring now to FIG. 2B in view of FIG. 2A, I-V curve of the local amplify transistor 223 is illustrated when reading. When the memory cell 210 stores data "0", the local bit line 217 is discharged to VSS voltage, while the local pre-charge transistor 221 is turned off by de-asserting a local pre-charge signal 221A to high, and which flows a turn-on current ID0 through the local amplify transistor 223. On the contrary, when the memory cell 210 stores data "1", the local bit line 217 keeps the pre-charged voltage. Thereby the local amplify transistor 223 is in sub-threshold region, and which flows only leakage current ID1.

Figure 2C:
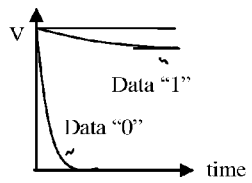
FIGS. 2C, 2D and 2E illustrate timing diagrams for the related the SRAM.

Referring now to FIG. 2C in view of FIG. 2A, discharge time of the local bit line 217 is illustrated. When the storage node of the selected memory cell stores low voltage data, the local bit line 217 is quickly discharged to VSS voltage, which is data "0". On the contrary, when the storage node of the selected memory cell stores high voltage data, the local bit line 217 keeps near VDD voltage, which is data "1". And there is still leakage current through unselected memory cells containing low voltage data (not shown). In order to sustain the local bit line voltage 217 near VDD voltage when reading data "1", the local pre-charge transistor 221 is composed of low threshold voltage transistor alternatively, which provides sub-threshold leakage current and sustains near VDD voltage, and the pass transistors are composed of slightly longer channel transistor for reducing leakage current.

Figure 2D:
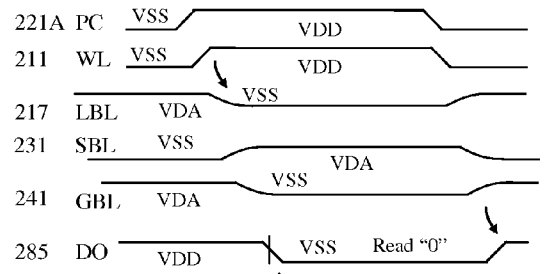

Referring now to FIG. 2D in view of FIG. 2A, detailed timing diagram for reading data "0" is illustrated. To read data, the local pre-charge (PC) signal 221A is raised to high, and the word line including 211 and 215 is raised to a predetermined voltage, or only one word line 211 is raised. Hence the local bit line (LBL) 217 is discharged by the selected memory cell 210 from VDA voltage to VSS voltage. By discharging the local bit line, the local amplify transistor 223 is turned on, which charges the segment bit line (SBL) 231 when the segment reset transistor 232 is turned off. Charging the segment bit line (SBL) 231, the global bit line (GBL) 241 is pulled down to VSS voltage by the segment sense amp 230, so that the global amp node 251 is raised to VDA voltage, which changes the latch node 256 through the pull-down path. Changing the latch node 256, the forwarding read line 275 is changed through and the read switch 272 and the read inverter 274, and which output is transferred to the output node (DO) 285 through the returning read path including inverting buffers 281, 282, 283 and 284.

During read operation, there is no phase control such that the memory cell data is immediately transferred to the output node (DO) 285 through the read path. More specifically, the local amplify transistor 223 waits until the local bit line is discharged by the selected memory cell. Hence, read control is relatively simple, which also realizes fast access with lightly loaded bit line. After reading the data, all the control signals including the local pre-charge (PC) signal 221A, the word line, and other control signals, are returned to pre-charge state or standby mode. And during standby, the data input 261 keeps high state, which also establishes high output to the output node 285 before reading data "0".

Figure 2E:
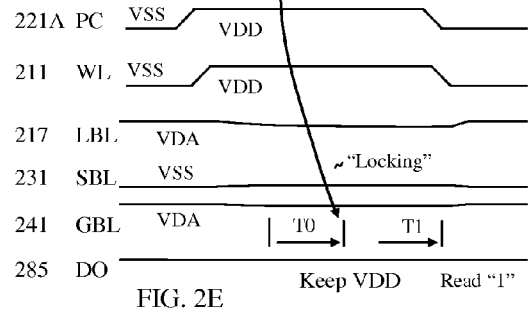

Referring now to FIG. 2E in view of FIG. 2A, detailed timing diagram for reading data "1" is illustrated. When the stored data is "1", the local bit line (LBL) 217 is not discharged by the memory cell, which does not turn on the local amplify transistor 223. And the segment bit line 231 keeps the reset state, and the global bit line 241 keeps the pre-set state. Thereby, the latch node is not changed, thus the output (DO) 285 keeps pre-charge state as well. However, the segment bit line (SBL) 231 is very slowly charged by the turn-off current through the local amplify transistor. The leakage current depends on how many cells are connected to the bit line and how many cells store low voltage data in the storage node, because low voltage data generates leakage current while high voltage data helps the selected local bit line to keep the pre-charge voltage. When the local bit line 217 is reached to the threshold voltage of the PMOS local amplify transistor 223 by the leakage current, the local amplify transistor 223 starts to pull up a gate of the segment amplify transistor 233 which pulls down the global bit line (GBL) 241 weakly. Hence, the global bit line 241 is gradually pulled down, which may change the read output. And for reducing turn-off current when reading data "1" and standby, the local amplify transistor is composed of longer channel length transistor than that of the segment reset transistor of the segment sense amp, and the segment amplify transistor is composed of longer channel length transistor than that of the global pre-set transistor of the global sense amp. And the reference signal is generated by fast data (low voltage data) with delay time as shown TO, so that the timing margin Ti is defined to reject slow data (high voltage data).

Figure 2F:
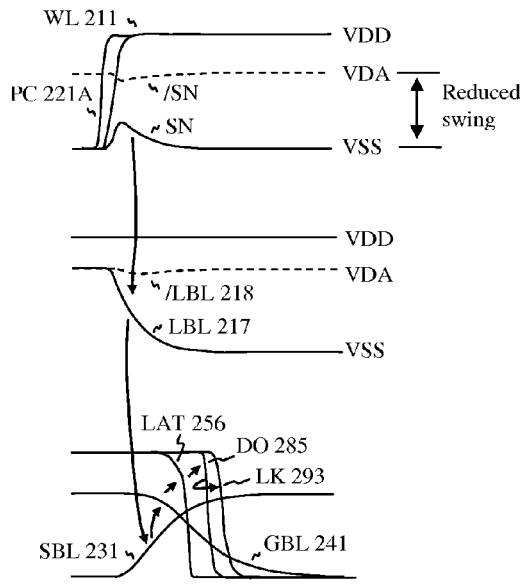
FIGS. 2F and 2G illustrate simulated waveforms with SPICE simulator, according to the teachings of the present invention.

Referring now to FIG. 2F in view of FIG. 2A, waveforms from SPICE circuit simulator are illustrated when reading data "0", wherein the local pre-charge (PC) signal 221A is raised to high for releasing the local bit line, and the word line (WL) 211 is raised to VDD voltage. Hence the local bit line (LBL) 217 is discharged by the selected memory cell from VDA voltage to VSS voltage, while a storage node (SN) of the memory cell is slightly disturbed by charges of the local bit line and an inverting storage node (/SN) is less disturbed because the inverting bit line (/LBL) 218 keeps the pre-charged voltage. By discharging the local bit line 217, the segment bit line (SBL) 231 is raised by the local amplify transistor when the segment reset transistor 232 is turned off. Raising the segment bit line (SBL) 231, the global bit line (GBL) 241 is pulled down to VSS voltage by the segment sense amp 230, so that the global amp node 251 is changed to high and the latch node (LAT) 256 is changed to low, which changes the other latch node 271 to high from low. Changing the other latch node 271, the output node (DO) 285 is changed to low through the read inverter and the returning read path. Additionally, the locking signal (LK) 293 is generated by the reference signal based on data "0" for locking the latch circuit with the delay circuit 292.

Figure 2G:
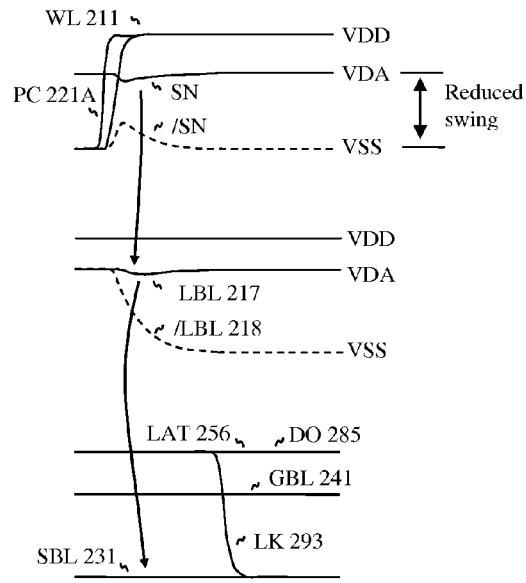

Referring now to FIG. 2G in view of FIG. 2A, simulated waveforms are illustrated when reading data "1", wherein the local pre-charge (PC) signal 221A is raised to high for releasing the local bit line, and the word line (WL) 211 is raised to VDD voltage. But the local bit line (LBL) 217 is not discharged by the selected memory cell from VDA voltage to VSS voltage, while a storage node (SN) of the memory cell is less disturbed by charges of the local bit line pre-charging at VDA voltage. Since the local bit line 217 is not discharged, the segment bit line (SBL) 231 keeps reset state and the global bit line (GBL) 241 keeps pre-set state, so that the latch node (LAT) 256 keeps high and the output node (DO) 285 keeps high. In order to keep the latch node to high state for a long cycle time, the time domain sensing scheme is realized by using the locking signal (LK) 293 which is generated by data "0" as the reference signal.

In this manner, the time-domain sensing scheme can differentiate low voltage data and high voltage data within a predetermined time domain through multi-stage sense amps. For example, the time-domain sensing scheme is more useful for page mode operation, such that a word line is asserted for long time with a row address while column addresses are changed frequently. When asserting a word line for long time, low data is quickly reached to the latch circuit, which generates a locking signal. And high data is very slowly changed within the long cycle time, but the locking signal effectively rejects high data to be latched to the latch circuit. In other words, fast cycle memory (with no page mode) does not require the locking signal which is generated by the reference signal based on reference cells, because high data is not reached to the latch circuit within a short cycle. Thus, an enable signal from a control circuit is used to control the latch circuit alternatively, which does not require reference cells and related circuits. Furthermore, power consumption is significantly reduced with the reduced swing amplifiers.

Figure 3:
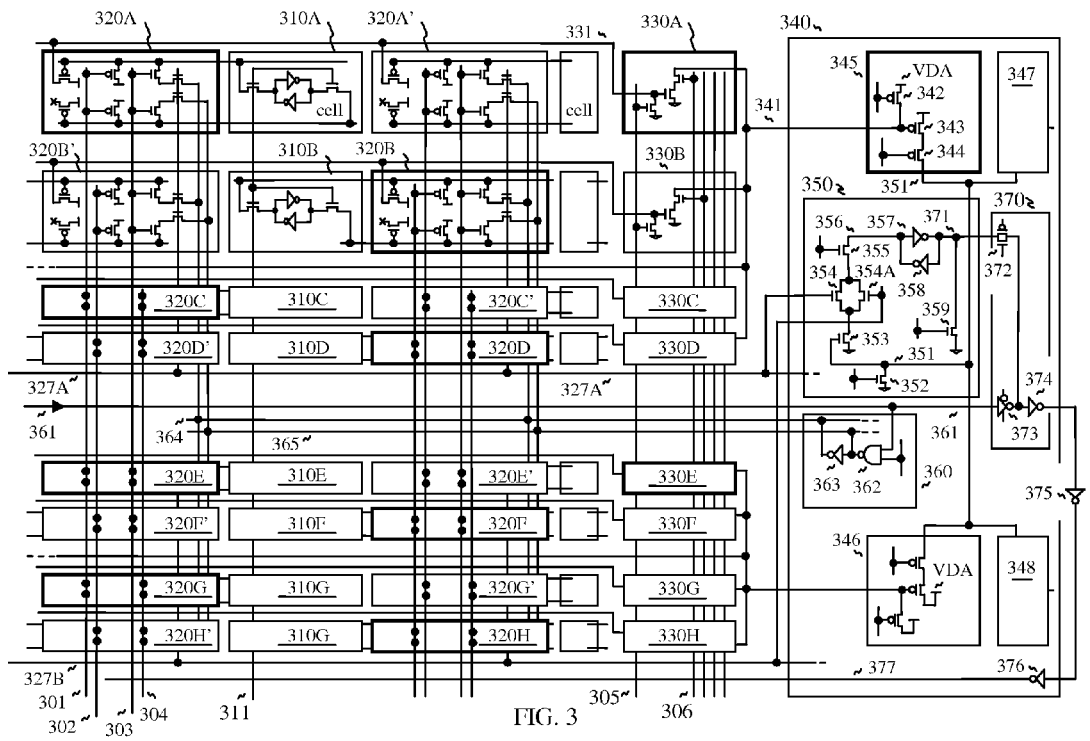
FIG. 3 illustrates a decoding scheme for the invented SRAM, according to the teachings of the present invention.

In FIG. 3, a decoding scheme for the invented SRAM is illustrated, wherein the memory cells 310A, 310B, 310C, 310D, 310E, 310F, 310G and 310H are controlled by the word line 311. Each memory cell is connected to the local sense amps 320A, 320B, 320C, 320D, 320E, 320F, 320G and 320H, respectively. And other adjacent local sense amps 320A', 320B', 320C', 320D', 320E', 320F', 320G' and 320H' are connected to other adjacent memory cells, respectively, because the adjacent local sense amp 320B', 320D', 320F' and 320H' are connected to left hand side memory cells, and the adjacent local sense amp 320A', 320C', 320E' and 320G' are connected to right hand side memory cells, respectively. And selected data is transferred to the global sense amp 340 wherein the global sense amp 340 is composed of the write circuit 360, the read circuits 345, 346, 347, and 348, and the data transfer circuit 370.

When writing, one of eight memory cells is selected and overwritten. For instance, a column select signal 327A is asserted to high and a write enable signal 303 is also asserted to high, so that the local sense amp 320A is enabled and a write path is turned on. And the pre-charge control signals 301 and 302 are de-asserted for releasing the local bit lines, which selects the local sense amp 320B' as well, but overwrite operation is executed for the unselected memory cells which are connected to the local sense amp 320B', because the word line is not activated for the unselected memory cells. And other local sense amps are not enabled, such that unselected column select signal 327B and unselected write enable signal 304 are not asserted and the right hand side local sense amps are not enabled either. In doing so, only selected local sense amp 320A is enabled and the write circuit 360 is enabled for driving the write bit line pair 364 and 365 for writing. During write operation, read path is not activated.

When reading, eight local sense amps 320A, 320B, 320C, 320D, 320E, 320F, 320G and 320H are activated, and those outputs are transferred to the segment sense amps 330A, 330B, 330C, 330D, 330E, 330F, 330G and 330H respectively. Then two segments 330A and 330E, for example, are selected by one segment select signal 306 while the segment reset signal 305 is de-asserted to low. And one of the read circuits 345 and 347 is selected. For example, the memory cell 310A is selected by selecting the local sense amp 320A, and the segment sense amp 330A. And its output is transferred to the read circuit 345 through the global bit line 341 when other read circuits 346, 347 and 348 are disabled, so that the read output of the read circuit 345 is transferred to the latch circuit 350. When the stored data is data "0", the global amp node 351 is raised to high because the global amplify transistor 343 is turned on, while the global amp enable transistor 344 is enabled, but the global pre-set transistor 342 is turned off. By raising the global amp node 351, the left latch node 356 is lowered, such that the latch flip transistor 353 is turned on, while the column select transistor 354 is turned on by asserting the column select signal 327B, but another column select transistor 354A is turned off. And the locking transistor 355 is turned on. After lowering the left latch node 356, the right latch node 371 is raised to high while the latch reset transistor 359 is turned off. Hence, the latched data is stored in the cross coupled inverter latch including 357 and 358. By raising the right latch node 371, data output 377 is lowered the inverting buffers 374, 375 and 376, because the read switch 372 is turned on while the bypass tri-state inverter 373 is turned off for the select memory block. In contrast, data output 377 keeps high when reading data "1".

Figure 4:
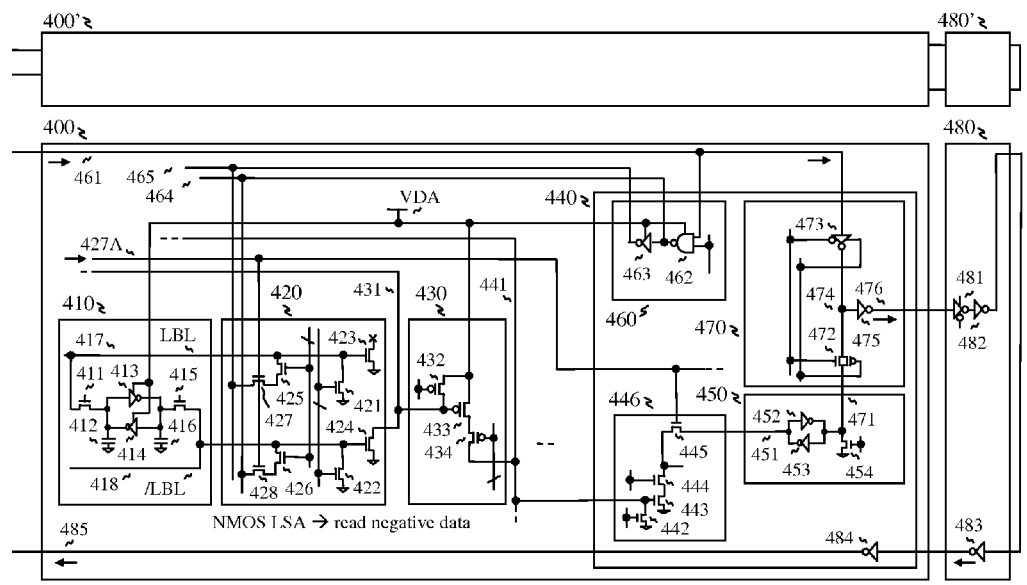
FIG. 4 illustrates an alternative configuration for realizing the SRAM, according to the teachings of the present invention.

In FIG. 4, alternative configuration for realizing the SRAM is illustrated, wherein a memory block 400 comprises memory cell 410, a local sense amp 420 as the first reduced swing amplifier, a segment sense amp 430 as the second reduced swing amplifier, and a global sense amp 440 including the third reduced swing amplifier. In particular, the local sense amp 420 is composed of NMOS pre-charge transistor and NMOS amplify transistor as an alternative configuration. And the memory cell 410 includes two pass transistors 411 and 415, and a latch including two inverters 413 and 414. Alternatively, two capacitors 412 and 416 are connected to the storage nodes for preserving charges. In a bulk CMOS SRAM, if the operation voltage further drops, the amount of charge stored in the storage node drops, so that the potential fluctuation of the storage node due to alpha rays cannot be suppressed, deteriorating the soft error resistance. In order to improve alpha ray immunity, capacitors are added to the memory cell for preserving charges, which increases alpha ray immunity, realizes fast read operation and protects the storage node with charges during write operation.

When reading data "0", the inverting local bit line 418 as an inverting node is raised by the selected memory cell 410. By raising the inverting local bit line 418, the segment bit line 431 is discharged by the local sense amp 420 to VSS voltage, wherein the local sense amp 420 is composed of the local reset transistor 421 for resetting the non-inverting local bit line pair 417, and another local reset transistor 422 for resetting the inverting local bit line 418, the write transistors 425, 426, 427 and 428 for writing data through the write bit line pair 464 and 465, and the NMOS local amplify transistor 424 for reading the inverting local bit line 418 while another amplify transistor 423 is used only for compensating gate capacitor to the non-inverting local bit line 417. By reading inverting local bit line, the polarity of the global bit line 441 is recovered to positive phase.

Discharging the segment bit line 431, the global bit line 441 is pulled up by the segment sense amp 430 when the segment select transistor 434 is turned on, but the segment pre-charge transistor 432 is turned off. By pulling up the global bit line 441, a global latch node 451 of the global sense amp 440 is lowered to VSS voltage while the global enable transistor 444 is turned on but the global reset transistor 442 is turned off, wherein the global sense amp 440 is composed of a read circuit 446, a latch circuit 450 a data transfer circuit 470 and a write circuit 460. More specifically, the read circuit 446 serves as the third reduced swing amplifier, such that the read circuit is composed of a global reset transistor 442 for resetting the global bit line 441 to VSS voltage, a global amplify transistor 443 for reading the global bit line 441, and a global amp enable transistor 444 for enabling the global amplify transistor 443, where the global amp enable transistor 444 serves as the locking transistor as well. The column select transistor 445 is controlled by the column select signal 427A. And the latch circuit 450 is composed of a latch reset transistor 454 for resetting the right latch node 471, and the latch circuit 450 serves as a level shifter for transferring data "0" to data output node through the data transfer circuit 470, wherein the data transfer circuit 470 is composed of the transmission gate 472 as the read switch, the bypass tri-state inverter 473 and the read inverter 475 which is connected to a common node 474 for receiving one of outputs from the read switch and the bypass tri-state inverter. Thus, data "0" is transferred to data output node 485 through the data transfer circuit 470 and inverting buffers 481,482, 483 and 484, when the read switch is turned on.

The first reduced swing amplifier 420, the second reduced swing amplifier 430, and the third reduced swing amplifier 446 of the global sense amp are powered by the variable array voltage VDA for adjusting voltage, which is useful for reducing operation power.

The write circuit 460 is composed of a receiving gate 462 and an inverting gate 463, such that the receiving gate 442 is connected to forwarding write line 461 serving as forwarding write path, and the inverting gate 463 receives an output from the receiving gate for driving a write bit line pair 464 and 465. For writing, the local bit line pair 418 and 417 is driven by the receiving gate and the inverting gate through the write bit line pair 464 and 465 when the write transistors 425, 426, 427 and 428 are turned on. And the pass transistors in the memory cell are also turned on in order to transfer the write data.

Figure 5:
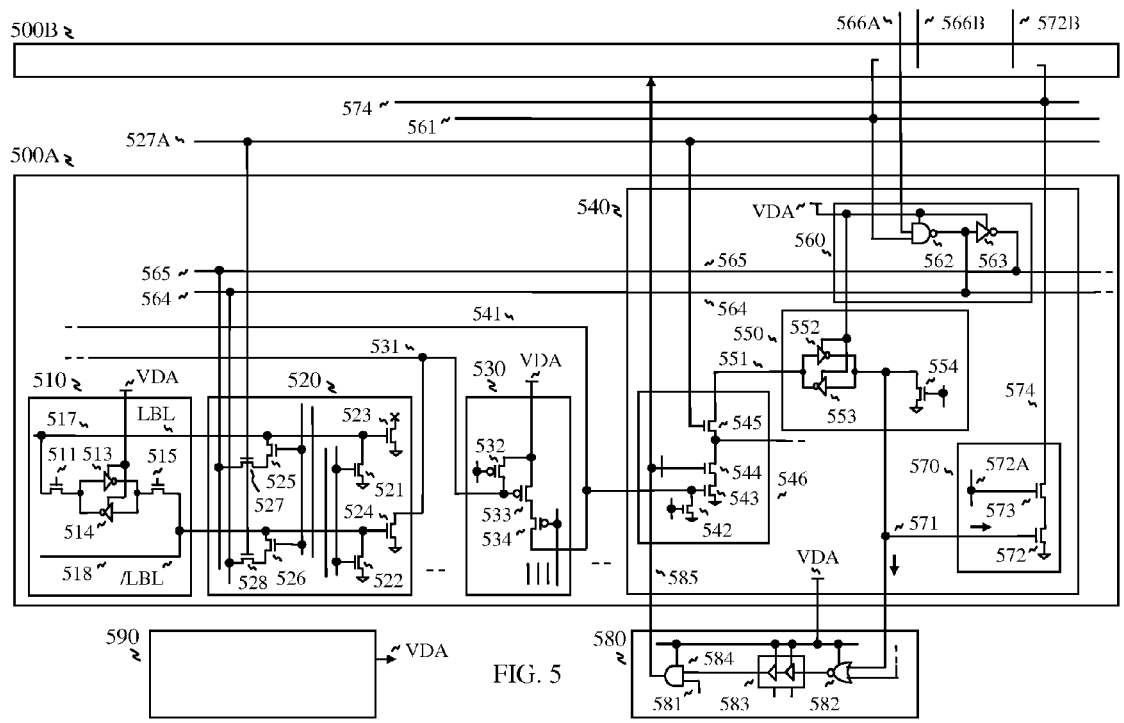
FIG. 5 illustrates an alternative configuration with a global latch circuit, according to the teachings of the present invention.
Figure 6B:
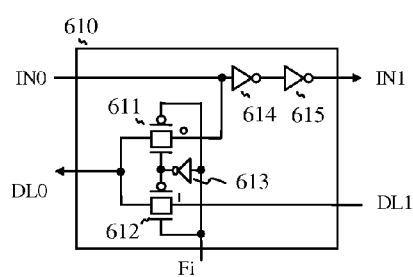
FIG. 6B illustrates a delay unit of the tunable delay circuit.

In FIG. 5, alternative configuration with a pull-down type data transfer circuit is illustrated, wherein a memory block 500 comprises memory cell 510, a local sense amp 520 as the first reduced swing amplifier, a segment sense amp 530 as the second reduced swing amplifier, and a global sense amp 540 including the third reduced swing amplifier. The reduced swing amplifiers are supplied by the array voltage VDA which is generated by the variable voltage regulator 590 (where detailed circuit is shown in FIG. 6D) for adjusting voltage. The variable voltage regulator and the reduced swing amplifiers are useful for reducing operation power. Particularly, the latch circuit 570 and the delay circuit 580 are supplied by the variable voltage regulator 590 as well for reducing more power consumption.

The local sense amp 520 is composed of NMOS pre-charge transistor and NMOS amplify transistor. And the memory cell 510 includes two pass transistors 511 and 515, and a latch including two inverters 513 and 514. When reading data "0", the inverting local bit line 518 is raised to the VDA voltage from VSS voltage by the selected memory cell 510. By raising the inverting local bit line 518, the segment bit line 531 is discharged by the local sense amp 520 to VSS voltage, wherein the local sense amp 520 is composed of the local reset transistor 521 for resetting the non-inverting local bit line pair 517, and another local reset transistor 522 for resetting the inverting local bit line 518, the write transistors 525, 526, 527 and 528 for writing data through the write bit line pair 564 and 565, and the NMOS local amplify transistor 524 for reading the inverting local bit line 518 while another amplify transistor 523 is used only for compensating gate capacitor to the non-inverting local bit line 517.

Discharging the segment bit line 531, the global bit line 541 is pulled up by the segment sense amp 530 when the segment select transistor 534 is turned on, but the segment pre-charge transistor 532 is turned off. By pulling up the global bit line 541, a global latch node 551 of the global sense amp 540 is lowered to VSS voltage, while the global amp enable transistor 544 is turned on but the global reset transistor 542 is turned off, wherein the global sense amp 540 is composed of a read circuit 546, a latch circuit 550 a data transfer circuit 570 (or data read circuit) and a write circuit 560. More specifically, the read circuit 546 serves as the third reduced swing amplifier, such that the read circuit is composed of a global reset transistor 542 for resetting the global bit line 541 to VSS voltage, a global amplify transistor 543 for reading the global bit line 541, and a global amp enable transistor 544 for enabling the global amplify transistor 543, where the global amp enable transistor 544 serves as the locking transistor as well when the select signal 581 is selected for generating the locking and selecting signal 585. The column select transistor 545 is controlled by the column select signal 527A. And the latch circuit is composed of across coupled inverter latch including inverters 552 and 553, and a latch reset transistor 554 for resetting the right latch node 571.

And the data transfer circuit 570 serves as a level shifter for transferring data "0" to an data output node (not shown) through a read data bus 574, as long as a data sense amp (not shown) is supplied by VDD voltage for receiving the read output 571 from the data transfer circuit 570 and transferring the read output through a read data bus 574 to interface circuit (not shown), wherein the data transfer circuit 570 is composed of a data read transistor 572 for receiving the read output 571 and a read enable transistor 573. Thus, data "0" is transferred to the read data bus 574 when the data read transistor 572 is turned on by raising the right latch node 571 as the read output, while the read enable transistor 573 is turned on.

And there are various modifications and alternatives for configuring the SRAM, in order to read data from the memory cell through the multi-divided bit line with the reduced swing amplifiers. For example, two-stage sensing scheme is available such that the local sense amp is connected to the global sense amp without the segment sense amp (not shown).

In FIG. 6A, more detailed tunable delay circuit (as shown 292 in FIG. 2A) is illustrated, wherein multiple delay units 601, 602 and 603 are connected in series, the first delay unit 601 receives input IN and generates output OUT, the second delay unit 602 is connected to the first delay unit, and the third delay unit 603 is connected to the second delay unit 602 and generates outputs 604 and 605, and so on. Each delay unit receives a fuse signal, such that the first delay unit receives F0, the second delay unit receives F1, and the third delay unit receives F2. And more detailed delay unit is illustrated in FIG. 6B, wherein the delay unit 610 receives an input IN0 and a fuse signal Fi, thus the fuse signal Fi selects output from the input IN0 or input DL1, so that a transfer gate 611 is turned on when the fuse signal Fi is low and output of inverter 615 is high, otherwise another transfer gate 615 is turned on when the fuse signal Fi is high and output of inverter 615 is low to bypass DL1 signal. Inverter chain 614 and 615 delays IN0 signal for the next delay unit, where more inverter chains or capacitors can be added for the delay even though the drawing illustrates only two inverters.

Figure 6C:
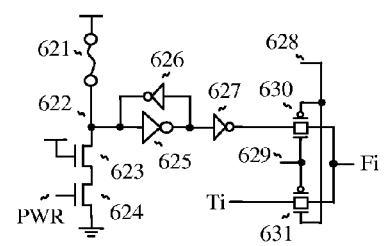
FIG. 6C illustrates a related fuse circuit for the tunable delay circuit.
Figure 6D:
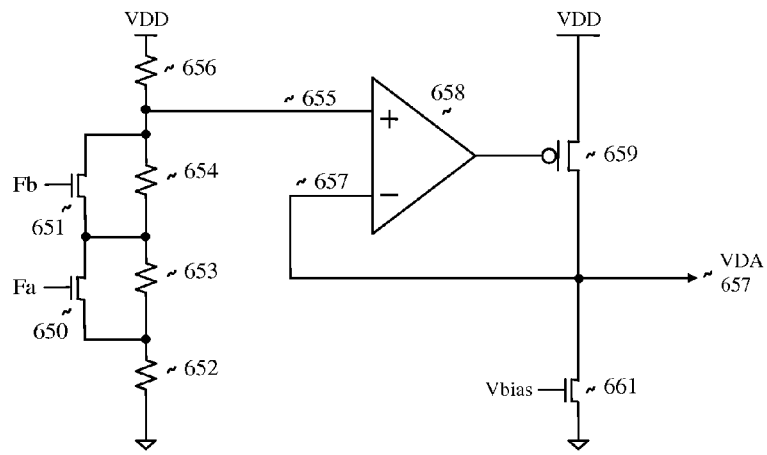
FIG. 6D illustrates a variable voltage regulator for supplying variable voltage to the sense amps, according to the teachings of the present invention.

In FIG. 6C, a related fuse circuit of the tunable delay circuit (as shown in FIG. 6A) is illustrated in order to store information for the delay time, so that a fuse serves as a nonvolatile memory, wherein a fuse 621 is connected to a latch node 622, a cross coupled inverter latch including two inverters 625 and 626 are connected to the latch node 622, pull-down transistors 623 and 624 are connected serially to the latch node 622 for power-up reset. Transfer gate 630 is selected by a select signal 629 (high) and another select signal 628 (low) in order to bypass the latch node voltage 622 through inverter 625 and 627. In doing so, fuse data is transferred to output node Fi, otherwise test input Ti is transferred to Fi when a transmission gate 631 is turned on.

In FIG. 6D, a variable voltage regulator is illustrated for supplying the array voltage VDA to the reduced swing amplifiers, wherein a reference voltage 655 is generated by a variable voltage reference circuit, such that a first resistor 652 is connected to a second resistor 653, the second resistor 653 is connected to a third resistor 654, and the third resistor 654 is connected to a fourth resistor 656, serially. Hence, the supply voltage VDD is reduced to the reference voltage output 655 by the ratio of the resistance value. And the reference voltage output 655 is tunable with turn-on or turn-off state of the transistors 650 and 651. In addition, the transistors are controlled by control signals Fa and Fb, respectively. And the control signals Fa and Fb are generated by the fuse circuit as shown in FIG. 6C, where turn-on resistance of the transistor is much smaller than the resistance value of the resistor. And the reference voltage 655 is buffered by an op amp 658, so that the variable voltage VDA is generated by the op amp 658 and a big driver transistor 659. Generally, a voltage difference between two op amp inputs 655 and 657 is equal or very close. In doing so, the variable voltage output VDA is almost equal to the reference voltage 655. And a weak current sink transistor 661 is connected to the VDA voltage output 657 for stabilizing the output, wherein the current sink transistor 661 is controlled by a bias voltage Vbias.

Figure 7A:
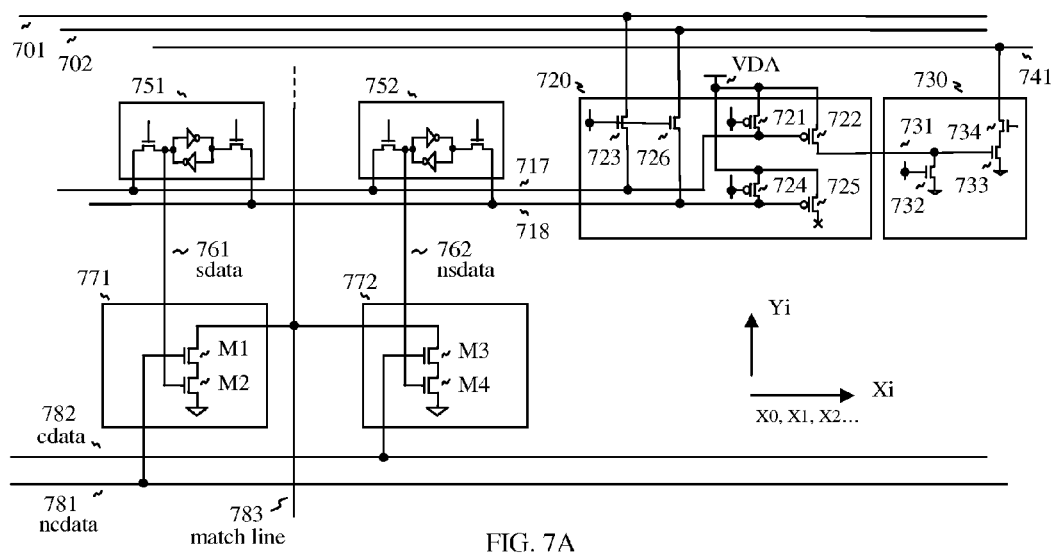
FIG. 7A illustrates an example application for content addressable memory.

Additionally, in FIG. 7A, an example embodiment to implement CAM (content addressable memory) including multi-stage sense amps is illustrated. There are two memory cells 751 and 752, and two compare circuits 771 and 772 in a CAM cell. Read-write operation for the memory cells is the same as single port memory as explained above. And CAM operation is added in order to compare the stored data and the incoming data referred as comparand. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations.

Ternary CAM cells typically include a second memory cell that stores local mask data for the each ternary CAM cell. The local mask data masks the comparison result of the comparand data with the data stored in a first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. However, the conventional SRAM cell based CAM is slow and big because transistors of the memory cell is wider than minimum feature size in order to drive heavy bit line during read, as published, U.S. Pat. No. 6,480,406. And DRAM based CAM requires refresh operation, as published, U.S. Pat. No. 6,331,961. Thus the invented SRAM is useful for the CAM application, which realizes high-speed and high-density CAM.

Detailed schematic is illustrated as shown in FIG. 7A. The memory cells 751 and 752 store data in the storage nodes 761 and 762, respectively, and the bit line 717 is connected to the memory cells. And the local sense amp 720 includes precharge transistors 721 and 724, local amplify transistors 722 and 725, and write transfer transistors 723 and 726 for writing data through write data bus 701 and 702. And the local sense amp 720 is supplied by the low supply voltage VDA. The segment sense amp 730 is connected to the local sense amp 720 through the segment bit line 731, wherein the segment sense amp 730 includes a segment reset transistor 732, a segment amplify transistor 733 and a segment enable transistor 734 which is connected the global bit line 741. To read data, the local sense amp 720 receives voltage output from the memory cell through the bit line 717 while the inverting bit line 718 is not read, and the segment sense amp 730 receives voltage data from the local sense amp 720 through the segment bit line 731. To compare the stored data 761 and 762, and the incoming data 781 and 782, two compare circuits 771 and 772 including NMOS transistors M1 and M2, M3 and M4 are connected to a match line (ML) 783.

Figure 7B:
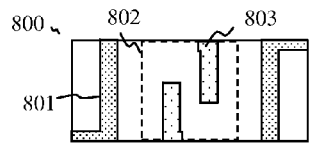
FIG. 7B illustrates a truth table summarizing the logical relationships among various signals for the content addressable memory, according to the teachings of the present invention.

Referring now to FIG. 7B in view of FIG. 7A, a truth table is shown summarizing the behavior of CAM cell in relation to signal states maintained by various elements within CAM cell in accordance with the present invention, wherein the compare circuits are configured by the NMOS M1 to M4. Thus, the signal polarities of the internal nodes are non-inverted for controlling the match line ML 783. First column T21 lists binary states of "0" and "1" that can be stored in storage node 762 (namely nsdata) of the memory cell 752; second column T22 lists binary states of "0" and "1" that can be stored in storage node 761 (namely sdata) of the memory cell 751. Third column T23 lists the ternary states that can be maintained in one of the complement compare data lines, namely cdata which is the signal 782. Fourth column T24 lists the ternary states that can be maintained in the other complement compare data line, namely ncdata which is the signal 781. Fifth column T25 lists "low" and "high" as the two available voltage levels for match line 783. Finally, sixth column T26 lists "match" and "mismatch" as the two possible results for comparing states of ncdata line 781 and cdata line 782 with the states of CAM cell.

Row T31 indicates masked case where sdata 761 and nsdata 762 are "0" which makes match line to stay the precharge level at logic high, regardless of the compare data, such that the stored data "0" has ground potential which turns off NMOS compare circuit M2 and M4, rows T32-T33 both indicate that "0" state of CAM cell is represented by "0" of memory cell 751, and "1" of memory cell 752. In row T32, because state "1" of cdata line 782 does not match state "0" of CAM cell (sdata 761), M3 and M4 set up a current path for the match line ML so that the match line ML is driven "low" to indicate a mismatch of the data key and the stored value of CAM cell. In row T33, because state "0" of cdata line 782 matches state "0" of CAM cell (sdata 761), match line ML is driven "high" to indicate a partial match of the comparand and the stored value of CAM.

Rows T34-T35 both indicate that "1" state of CAM cell is represented by "1" of memory cell 751 and "0" of memory cell 752. In row T34, because state "1" of cdata line 782 matches state "1" of CAM cell (sdata 761), match line 783 mL is driven "high" to indicate a partial match of the comparand and the stored value of CAM cell. In row T35, because state "0" of cdata line 782 does not match state "1" of CAM cell (sdata 761), M1 and M2 set up a current path for the match line ML, so that the match line ML is driven "low" to indicate a mismatch of the comparand and the stored value of CAM cell.

Methods of Fabrication

The memory cells can be formed from single crystal silicon as forming the conventional SRAM cell. Alternatively, the memory cells can be formed from thin film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used. The LTPS has been developed for the low temperature process (around 500 centigrade) on the glass in order to apply the display panel, as published, U.S. Pat. No. 5,395,804, U.S. Pat. No. 6,852,577 and U.S. Pat. No. 6,951,793. Now the LTPS can be also used as a thin film polysilicon transistor for the memory device on the wafer. The thin film based transistors can drive multi-divided bit line which is lightly loaded, even though thin film polysilicon transistor can flow less current than single crystal silicon based transistor on the surface of the wafer, for example, around 10~20 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. Furthermore, the memory cell including the pass transistor and the cross coupled inverter latch can be formed from various semiconductor materials, such as silicon-germanium and germanium. And the steps in the process flow should be compatible with the current CMOS manufacturing environment as published, U.S. Pat. No. 6,670,642, U.S. Pat. No. 6,174,764 and No. 5,734,179 for forming SRAM. In this respect, detailed manufacturing processes for forming the memory cell, such as width, length, thickness, temperature, forming method, or any other material related data, are not described in the present invention.

Figure 8A:
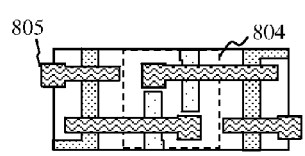
Figure 8B:
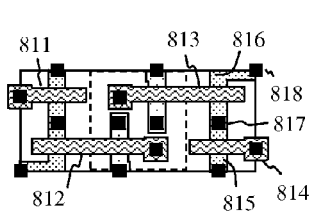
Figure 8C:
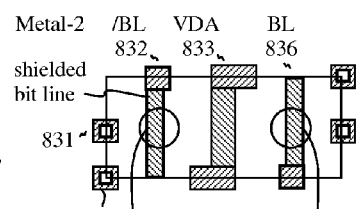
Figure 8E:
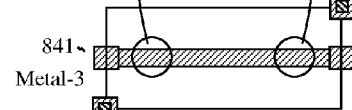
Figure 8F:
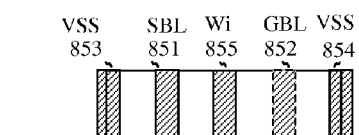

An example memory cell layout is illustrated in FIGS. 8A to 8G, wherein the memory cell is reduced with near minimum channel transistor because the reduced memory cell can drive the lightly loaded bit line as explained above. And, narrow metal-2 layer is used for forming the local bit line, which reduces parasitic capacitance. In contrast, metal-3 local bit line pair in a prior art includes wide metal line and metal-2 via for the connection, as published, U.S. Pat. No. 6,677,649. Furthermore, in the present invention the local bit line pair includes less parasitic capacitance because parallel routing line is relatively far from the bit lines. More specifically, in FIG. 8A, active region is defined for forming the memory cell 800, wherein active region 801 is n-type region and active region 803 is p-type active region on p-well region 802. In FIG. 8B, poly gate region 805 is defined, and p+ doping region 804 is illustrated for defining PMOS source and drain region. And in FIG. 8C, contact-2 region 818 is formed on the active region 815, 816 and 817, and poly gate regions 811, 812, 813, and 814. In FIG. 8D, metal-1 region 821 and via-1 region 822 are defined, and internal connection region 823 is defined for connecting the cross coupled latch. In FIG. 8E, metal-2 region is defined such that metal-2 region 831 is defined for connecting the word line, local bit lines 832 and 836 are defined for connecting metal-1 region, metal-2 region 833 is defined for supplying VDA voltage, and metal-2 region 834 is defined for forcing ground voltage. And via-2 region is defined on the metal-2 region. And the local bit line pair is narrower than the metal line for a supply line 833 in the same direction. In FIG. 8F, metal-3 region is defined such that metal-3 region 841 is defined for connecting the word line through the metal-2 region 831. And via-3 region is defined on the metal-3 region. In FIG. 8G, metal-4 region is defined, such that metal-4 region 853 and 854 provide ground (VSS) voltage, and metal-4 region 851 is used as the segment bit line, metal-4 region 852 is used as the global bit line, and metal-4 region 855 is used as the write column select signal for selecting a column during write operation, where the segment bit line 851 and the write column select signal 855 are repeating, but the global bit line is not repeating, because there is only one global bit line in eight columns (not shown). For example, the forwarding write line (261 in FIG. 2A) may be passed over the next memory cell.

In FIG. 8H, base layers including active region and poly gate region are illustrated again for showing an arrow "A" which shows a cross sectional view of the memory cell 800. In FIG. 8I, n-type active regions 815, 816 and 817 (also shown in FIGS. 8C and 8H as top views) is shown vertically on p-type substrate 899 for forming transistors, where active region 817 serves as the storage node. Poly gate (word line) region 814 is formed on gate oxide region to form NMOS transistor as shown the arrow "A" (shown in FIG. 8H). After forming the transistors, metal-1 region 821 is formed, and metal-2 region 832 is formed for connecting the local bit line. Metal-3 region 814 is formed on the local bit line. As shown in the cross sectional view, the local bit line 832 includes less parasitic element, because the metal-2 local bit line 832 is less deeper (as shown the depth 860) than that of metal-3 and less coupled with upper metal-4 layers, and there is only one metal-3 region 841 for connecting the word line. And metal-4 region 851 is passed over the local bit line (as shown in FIG. 8G) but the distance is farther that other layers. Furthermore, the metal-2 local bit line is shielded from other routing layers.

In FIG. 9A, metal layer for explaining a cross sectional view of the related memory cell is illustrated, wherein transistors are formed from thin film polysilicon layer for stacking. And, the body-tied TFT (thin film transistor) is used, in order to alleviate self heating problem of the short channel thin film transistor. To do so, VSS voltage is applied to the p-type body of the NMOS TFT for biasing the pull-down thin film transistors through metal regions 922 and 923. Similarly, VDD voltage is applied to the n-type body of the PMOS TFT for the pull-up thin film transistors through metal regions 924 and contact region 915. And cross sectional view will be shown in direction "B" as below in FIG. 9B.

In FIG. 9B, the cross sectional view of the related memory cell with the body-tied TFT is illustrated, wherein a first floor memory cell 910 is composed of metal-1 (M-1) region as the bias line for applying bias voltage to the body of the transistor through p-type contact region 915 shown in the direction "B", metal-2 (M-2) region is formed on the transistors, metal-3 (M-3) region is formed for connecting the local bit line, and metal-4 (M-4) region is formed for connecting a first word line (WL1). In the similar manner, a second floor memory cell 920 is composed of metal-5 (M-5) region as the bias line shown in the direction "B", metal-6 (M-6) region is formed on the transistors, metal-7 (M-7) region is formed for connecting the local bit line, and metal-8 (M-8) region is formed for connecting a second word line (WL2). The memory cells are stacked over the wafer 999.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
    a first reduced swing amplifier serving as a local sense amp which is connected to the memory cell through a local bit line pair, wherein the first reduced swing amplifier is composed of a local pre-charge transistor pair for pre-charging the local bit line pair to an array voltage, a local amplify transistor for reading an output from one of the local bit line pair where the local amplify transistor is connected to a segment bit line, and a series write transistor pair for driving the local bit line pair; and a memory cell including a pass transistor pair and a cross coupled inverter latch; and
    a second reduced swing amplifier serving as a segment sense amp which is connected to the segment bit line, wherein the second reduced swing amplifier is composed of a segment reset transistor for resetting the segment bit line to a ground voltage, a segment amplify transistor for reading the segment bit line, and a segment enable transistor for enabling the segment amplify transistor; and
    a third reduced swing amplifier including a global pre-set transistor for pre-setting a global bit line connecting to the segment enable transistor to the array voltage, a global amplify transistor for reading the global bit line, and a global enable transistor for enabling the global amplify transistor; and
    a global sense amp including a read circuit, a latch circuit, a data transfer circuit and a write circuit, wherein the read circuit is composed of the third reduced swing amplifier, the latch circuit is composed of a cross coupled inverter latch which is connected to a left latch node and a right latch node where the left latch node is connected to a pull-down path including a locking transistor, at least a column select transistor, and a latch flip transistor for receiving an output of the read circuit through a global amp node which is reset by a global node reset transistor, and the right latch node is connected to a latch reset transistor for resetting the right latch node, and the data transfer circuit is composed of a selector circuit for selecting an output from the latch circuit or a data from a previous memory block, and the write circuit is composed of a receiving gate and an inverting gate for transferring a write data to the series write transistor pair through a write bit line pair; and a variable voltage regulator for generating the array voltage; and a delay circuit for generating a locking signal which is generated by a reference signal based on at least a reference memory cell for locking the locking transistor of the latch circuit.

2. The memory device of claim 1, wherein the first reduced swing amplifier includes a reset transistor pair for resetting the local bit line pair to the ground voltage, the local amplify transistor for reading an output from one of the local bit line pair where the local amplify transistor is connected to the segment bit line, and the series write transistor pair for driving the local bit line pair; and the second reduced swing amplifier is composed of a segment pre-set transistor for pre-charging the segment bit line to the array voltage, the segment amplify transistor for reading the segment bit line, and the segment enable transistor for enabling the segment amplify transistor; and the third reduced swing amplifier is composed of a global reset transistor for resetting the global bit line to the ground voltage, the global amplify transistor for reading the global bit line, and the global enable transistor for enabling to the global amplify transistor.

3. The memory device of claim 1, wherein the data transfer circuit is composed of a data read transistor for receiving an output from the latch circuit and a read enable transistor for enabling the data read transistor.

4. The memory device of claim 1, wherein the delay circuit includes a tunable delay circuit, such that the tunable delay circuit receives multiple reference signals which are generated by multiple reference memory cells; and the tunable delay circuit generates the locking signal by delaying at least one reference signal from the multiple reference signals; and tuning information for the tunable delay circuit is stored in a nonvolatile memory.

5. The memory device of claim 1, wherein the local bit line pair is composed of a second metal layer for connecting to the pass transistor pair, while a first metal layer is used for connecting internal nodes of the cross coupled inverter latch, a third metal layer is used as a word line, and a fourth metal layer is used as the segment bit line.

6. The memory device of claim 1, wherein the local bit line pair is composed of a metal layer for connecting to the pass transistor pair, and the local bit line pair are narrower than a metal line for a supply line in the memory cell in a same direction.

7. The memory device of claim 1, wherein the variable voltage regulator generates the array voltage with fuse circuits for setting the voltage level.

8. The memory device of claim 1, additionally comprising at least one compare circuit to configure a content addressable memory; and the compare circuit includes a first transistor set and a second transistor set, wherein a first signal set couples to control a conduction state of the first transistor set and a second signal set couples to control a conduction state of the second transistor set, wherein the first signal set includes stored data in the memory cell and the second signal set includes comparand data from an input device; and at least one compare circuit coupled among the memory cells and at least one match line to receive the first and second signal sets and affect a logical state of the match line, in response to a predetermined logical relationship between the first and second signal sets.

* * * * *